(12) United States Patent
Parkanzky et al.

(10) Patent No.: US 11,183,721 B2
(45) Date of Patent: Nov. 23, 2021

(54) THERMAL BARRIER INCORPORATING PHASE CHANGE MATERIAL FOR A POWER MODULE ASSEMBLY

(71) Applicant: GM GLOBAL TECHNOLOGY OPERATIONS LLC, Detroit, MI (US)

(72) Inventors: Elaine E. Parkanzky, Troy, MI (US); Karl C. Dorgan, West Bloomfield, MI (US); Faruk Sohag, Canton, MI (US); Rajesh K. Bhagirath, Lasalle (CA); Edgar P. Calderon, Sterling Heights, MI (US); John M. Moote, Plymouth, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 160 days.

(21) Appl. No.: 16/595,737

(22) Filed: Oct. 8, 2019

(65) Prior Publication Data

US 2021/0104793 A1    Apr. 8, 2021

(51) Int. Cl.
| | |
|---|---|
| *H01M 10/38* | (2006.01) |
| *H01M 10/6569* | (2014.01) |
| *H01M 10/658* | (2014.01) |
| *H01M 10/613* | (2014.01) |
| *H05K 7/20* | (2006.01) |

(52) U.S. Cl.
CPC ..... *H01M 10/6569* (2015.04); *H01M 10/613* (2015.04); *H01M 10/658* (2015.04); *H05K 7/20336* (2013.01)

(58) Field of Classification Search
CPC ........... H01M 10/6569; H01M 10/656; H01M 10/6561; H01M 10/6567; H01M 10/613; H01M 10/658; H01M 10/659; H01M 10/617; H05K 7/20336
See application file for complete search history.

(56) References Cited

U.S. PATENT DOCUMENTS 9,742,047 B2 *   8/2017   Ebner ................ H01M 10/659
10,116,017 B2 * 10/2018   Pingree .............. H01M 10/653
10,868,345 B2 * 12/2020   Ruehle .............. H01M 10/0525

\* cited by examiner

*Primary Examiner* — Raymond Alejandro
(74) *Attorney, Agent, or Firm* — Quinn IP Law

(57) ABSTRACT

A thermal barrier for use in a power module assembly having at least one battery cell and corresponding method of forming. The thermal barrier includes at least one compressible member having one or more pockets. A first layer and a second layer are positioned adjacent to the compressive member at a first side and a second side, respectively. The thermal barrier includes one or more phase change materials configured to be deposited into the pockets. The phase change materials are configured to undergo an endothermic phase change reaction when a temperature is at or above an activation temperature. The first layer and the second layer may be configured to at least partially reflect radiant heat. In one example, the phase change materials include a bicarbonate salt.

20 Claims, 3 Drawing Sheets

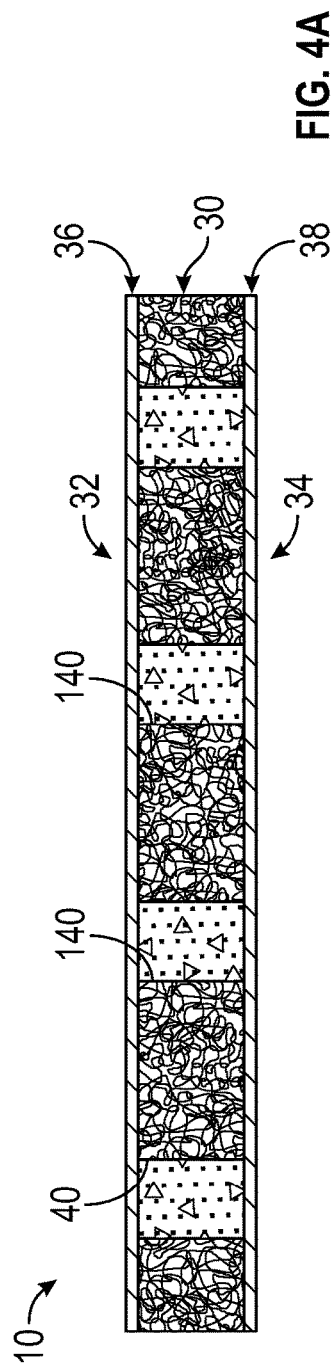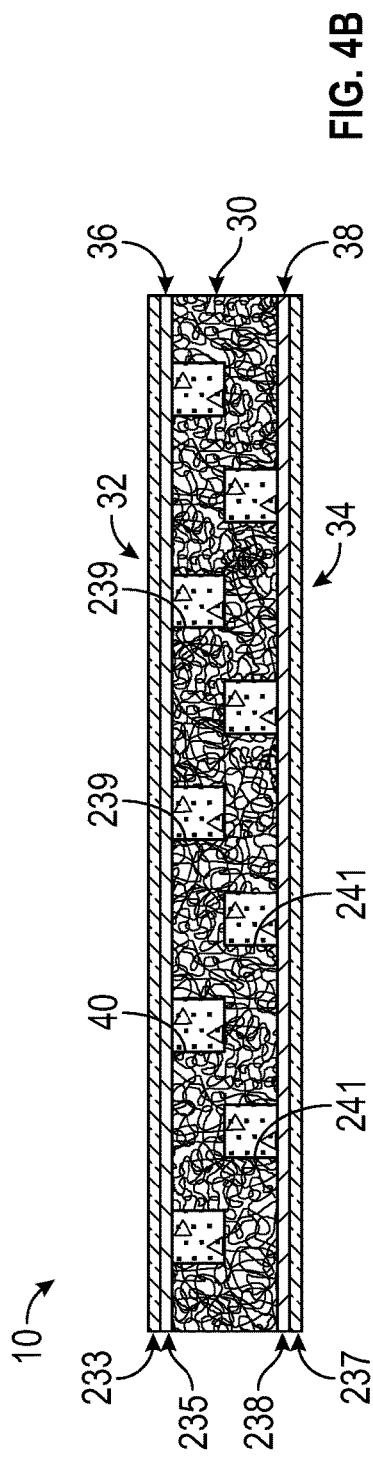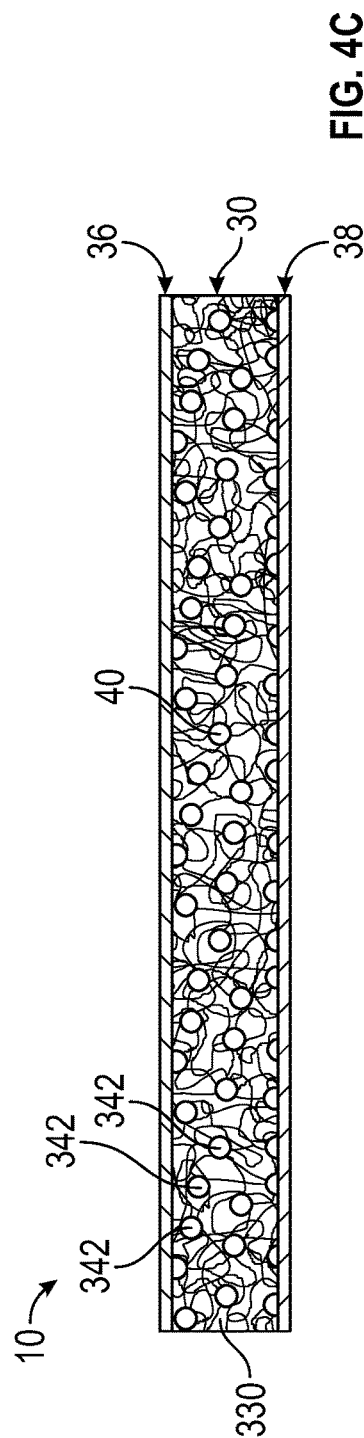

THERMAL BARRIER INCORPORATING PHASE CHANGE MATERIAL FOR A POWER MODULE ASSEMBLY

INTRODUCTION

The present disclosure relates to a power module assembly, a thermal barrier for use in the power module assembly and a corresponding method of forming the thermal barrier. The use of purely electric vehicles and hybrid vehicles, such as for example, battery electric vehicles, hybrid electric vehicles, plug-in hybrid electric vehicles and fuel cell hybrid electric vehicles, has greatly increased over the last few years. Fully and partially electric vehicles generally include a rechargeable energy storage component, such as a high voltage battery. The performance and life-span of the rechargeable batteries may be improved by controlling exposure to excessively high temperatures, such as for example, a thermal runaway situation.

SUMMARY

Disclosed herein is a power module assembly, a thermal barrier for use in the power module assembly and a corresponding method of forming the thermal barrier. The power module assembly includes at least one battery cell. The thermal barrier includes at least one compressible member ("at least one" omitted henceforth) having one or more pockets. A first layer and a second layer are positioned adjacent to the compressive member at a first side and a second side, respectively. The thermal barrier includes one or more phase change materials configured to be deposited into the one or more pockets. The phase change materials are configured to undergo an endothermic phase change reaction when a temperature is at or above an activation temperature.

In one example, the compressible member is composed of foam. The first layer and the second layer may be configured to at least partially reflect radiant heat. The phase change materials may include at least one of or a combination of: aluminum bicarbonate, ammonium bicarbonate, beryllium bicarbonate, calcium bicarbonate, lithium bicarbonate, magnesium bicarbonate, potassium bicarbonate and sodium bicarbonate.

The phase change materials may be selected such that the endothermic phase change reaction releases at least one fluid having flame extinguishing characteristics. In one example, the phase change materials include sodium bicarbonate and the fluid released includes carbon dioxide gas. In another example, the first layer includes an outer first layer and an inner first layer. The inner first layer may be configured to absorb the fluid produced in the endothermic phase change reaction while simultaneously producing a cooling effect. The outer first layer may be configured to In a first example, the pockets include at least one through hole extending from the first side to the second side of the at least one compressible member. In a second example, the pockets include a first set of blind holes extending along the first side and a second set of blind holes extending along the second side of the at least one compressible member. The first set of blind holes may be staggered relative to the second set of blind holes. In a third example, the compressible member is composed of a polymeric base such that the one or more phase change materials are internally distributed within the polymeric base.

In another example, the phase change materials include a first material characterized by a first activation temperature in a first range and a second material characterized by a second activation temperature in a second range. The method may include positioning the thermal barrier in a vicinity of the battery cell. The thermal barrier is configured to mitigate thermal propagation within the power module assembly in a situation with excessive temperatures. Additionally, the thermal barrier may be configured to address cell expansion of the battery cell during regular operation.

The above features and advantages and other features and advantages of the present disclosure are readily apparent from the following detailed description of the best modes for carrying out the disclosure when taken in connection with the accompanying drawings.

BRIEF DESCRIPTION OF THE DRAWINGS

FIG. 4A is a schematic sectional view of the thermal barrier of FIG. 1, in accordance with a first example;

FIG. 4B is a schematic sectional view of the thermal barrier of FIG. 1, in accordance with a second example; and FIG. 4C is a schematic sectional view of the thermal barrier of FIG. 1, in accordance with a third example.

DETAILED DESCRIPTION

Figure 1:
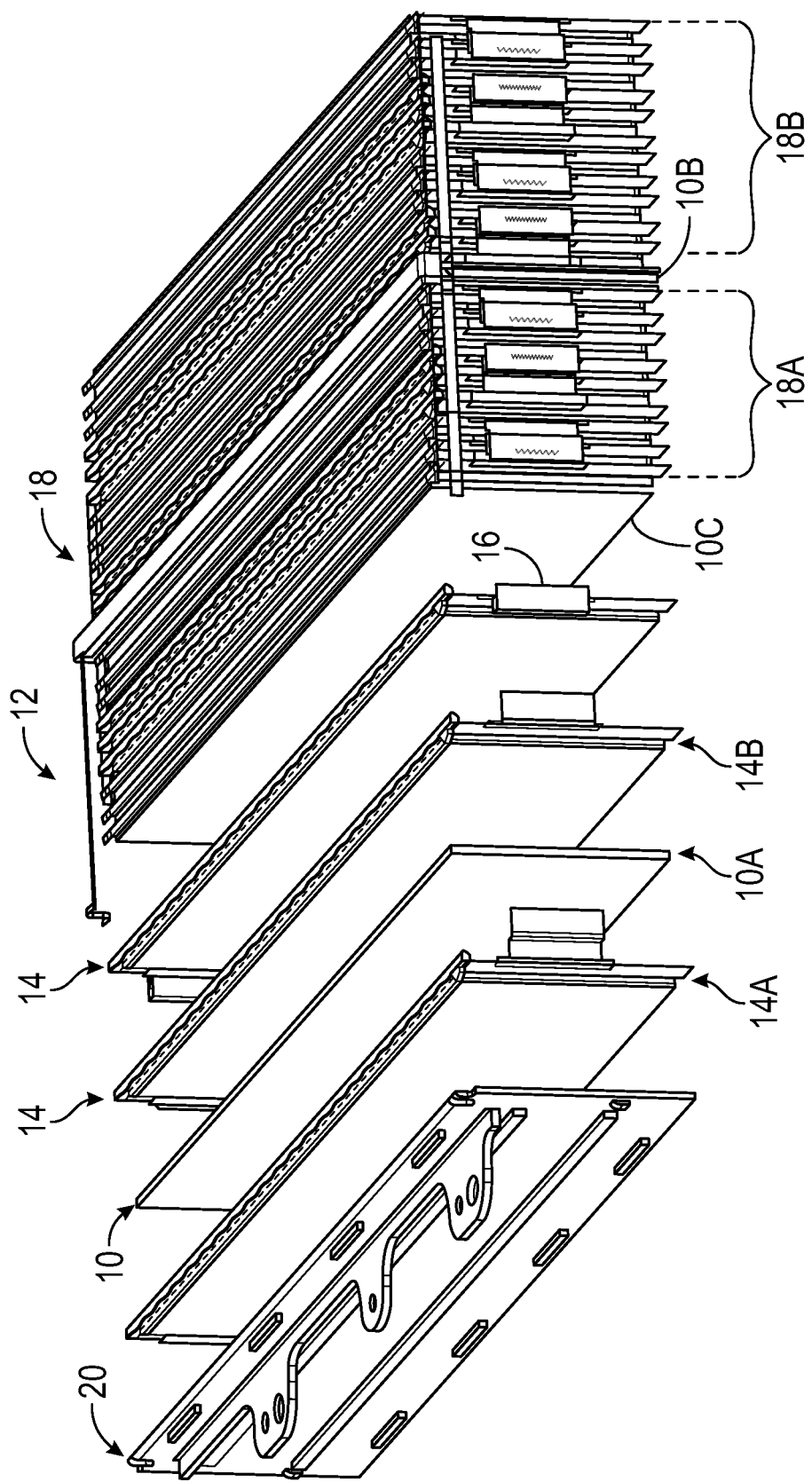
FIG. 1 is a schematic perspective partly-exploded fragmentary view of a power module assembly having a thermal barrier.

Referring to the drawings, wherein like reference numbers refer to like components, FIG. 1 schematically illustrates a thermal barrier 10 employed in a power module assembly 12. The power module assembly 12 may include multiple ones of the thermal barrier 10, such as a first thermal barrier 10A, a second thermal barrier 10B and a third thermal barrier 10C, shown in FIG. 1. The power module assembly 12 may be used as an energy storage unit for a fully electric or partially electric mobile platform, such as, but not limited to, a passenger car, sport utility vehicle, light truck, heavy duty vehicle, ATV, minivan, bus, transit vehicle, bicycle, robot, farm implement, sports-related equipment, boat, plane, train or other transportation device. The power module assembly 12 may take many different forms and include multiple and/or alternate components and facilities.

Referring to FIG. 1, the power module assembly 12 includes at least one battery cell 14 ("at least one" omitted henceforth). The battery cell 14 may be a can-type lithium ion battery cell or a pouch-type cell, including but not limited to, lithium manganese, lithium ion phosphate, lithium cobalt, lithium nickel-based cells. Each battery cell 14 may include one or more respective cell tabs 16 extending from its respective edges. Referring to FIG. 1, multiple ones of the battery cell 14 may be stacked or arranged in respective modules 18 and may be connected in series or in parallel. The power module assembly 12 may be supported or retained with a support member 20, which may be frame and/or a cover plate.

The thermal barrier 10 is configured to mitigate thermal propagation within the power module assembly 12 in a situation with excessive temperatures that may have resulted from a single one or multiple ones of the battery cell 14. Additionally, the thermal barrier 10 is configured to address cell expansion of the battery cell 14 during regular operation. The thermal barrier 10 is configured to interface with the battery cell 14 and may be positioned between individual ones of the battery cell 14 and/or between stacks of the battery cell 14 arranged in respective modules 18. Referring to FIG. 1, the first thermal barrier 10A is positioned between a first battery cell 14A and a second battery cell 14B. The second thermal barrier 10B is positioned between a first module 18A and a second module 18B.

Figure 2:
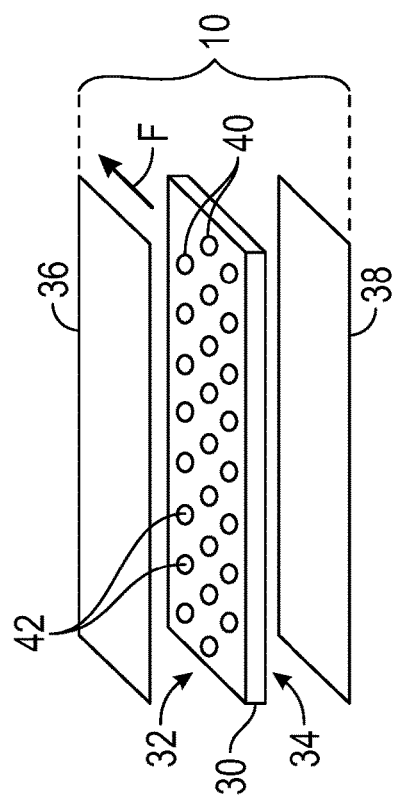
FIG. 2 is a schematic exploded view of the thermal barrier of FIG. 1.

Referring now to FIG. 2, a schematic exploded view of the thermal barrier 10 is shown. The thermal barrier 10 includes at least one compressible member 30 defining a first side 32 and a second side 34. The compressible material 30 is configured to absorb cell expansion of the battery cell 14 as desired while also serving as a thermal insulator. In one example, the compressible member 30 is composed of a foam material. In another example, the compressible member 30 is composed of a polymer including at least one of, or a combination of, poly-siloxane, poly-urethane and poly-acrylate. The compressible member 30 may be selected from an inert material such that it does not react with the phase change materials 42. A method 100 of forming the thermal barrier 10 is described below with respect to FIG. 3.

Referring to FIG. 2, the first layer 36 and a second layer 38 are positioned adjacent to the first side 32 and second side 34 of the compressible member 30, respectively. The first layer 36 and the second layer 38 may be configured to at least partially or fully encapsulate the compressible member 30. The first layer 36 and the second layer 38 may be co-extensive with the compressible member 30. The first layer 36 and the second layer 38 may be configured as heat reflection layers configured to at least partially reflect radiant heat energy and convective heat energy emanating from the battery cell 14. In one example, the first layer 36 and the second layer 38 are composed of aluminum or an aluminum alloy.

Referring to FIG. 2, the thermal barrier 10 includes one or more pockets 40 in which one or more phase change materials 42 ("one or more" omitted henceforth) are configured to be placed into or deposited. The pockets 40 that are filled with the phase change materials 42 may be configured to stay in place and prevent unwanted secondary reactions. The phase change materials 42 may be uniformly dispersed through the compressible member 30. The phase change materials 42 are configured to undergo an endothermic phase change reaction when a temperature of the battery cell 14 is at or above an activation temperature. In other words, the endothermic phase change reaction enables heat absorption from the power module assembly 12 when the temperature is at or above the activation temperature.

The phase change materials 42 may be employed in a solid form, as a powder and/or in the form of molded compressed pellets, with the form being varied based on the application. Referring to FIG. 2, the endothermic phase change reaction may produce a fluid F, which may include a liquid and/or a gas. The phase change materials 42 may be selected such that the fluid F that is released has flame extinguishing characteristics. In one example, the phase change materials 42 include a bicarbonate salt. For example, the phase change materials 42 may include sodium bicarbonate, with the endothermic phase change reaction represented as follows:

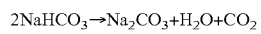

In the case of sodium bicarbonate, the products of the heat decomposition are solid sodium carbonate, $H_2O$ (which may be a liquid or gas depending on the temperature) and carbon dioxide gas. The carbon dioxide produced has flame extinguishing properties. In another example, the phase change materials 42 include at least one of or a combination of: aluminum bicarbonate, ammonium bicarbonate, beryllium bicarbonate, calcium bicarbonate, lithium bicarbonate, magnesium bicarbonate, potassium bicarbonate and sodium bicarbonate. The phase change materials 42 may include carbonates, such as for example, calcium carbonate which decomposes at around 840 Celsius. The phase change materials 42 may include chemicals with hydrates that release the water of hydration at certain temperatures.

The phase change materials 42 may include a first material characterized by a first activation temperature in a first range and a second material characterized by a second activation temperature in a second range, with the first range being different from the second range. This provides a technical advantage of increasing the dynamic range of response. In one example, the first material and second material may be selected such the first activation temperature is between about 80 and 90 Celsius and the second activation temperature is between about 130 and 140 Celsius. The first range may at least partially overlap with the second range.

In the example shown in FIG. 2, the pockets 40 are laid out uniformly and define a plurality of equally-spaced circles. However, it is understood that the size, individual shape and spacing of the pockets 40 may be varied based on the application at hand. Three example structures for the thermal barrier 10 are illustrated in FIGS. 4A, 4B and 4C. Referring to FIG. 4A, in accordance with a first example, the pockets 40 may include at least one through hole 140 extending from the first side 32 to the second side 34 of the compressible member 30. Alternatively, the pockets 40 may be made to a specified depth without breaking through to the other side. Referring to FIG. 4B, in accordance with a second example, the pockets 40 include a first set of blind holes 239 extending along the first side 32 and a second set of blind holes 241 extending along the second side 34 of the compressible member 30. The spacing within and the respective depths of the first set of blind holes 239 and the second set of blind holes 241 may be varied. As shown in FIG. 4B, the first set of blind holes 239 may be staggered relative to the second set of blind holes 241, in other words, arranged alternately along a direction parallel to the first layer 36.

Referring to FIG. 4C, in accordance with a third example, the compressible member 30 is composed of a polymeric base 330. The phase change materials 342 may be impregnated within the pockets 40 and internally distributed or interspersed in the polymeric base 330. The polymeric base 330 may include at least one of or a combination of poly-siloxane, poly-urethane and poly-acrylate. It is to be understood that the features described in each example may be combined with one or more other features from other examples. For example, the outer first layer 233 and the inner first layer 235 shown in FIG. 4B may be combined with the through hole 140 shown in FIG. 4A.

The first layer 36 and the second layer 38 may be respectively formed as a composite of multiple layers. Referring to FIG. 4B, the first layer 36 may include an outer first layer 233 and an inner first layer 235. The second layer 38 may include an outer second layer 237 and an inner second layer 238. The inner first layer 235 (and/or the inner second layer 238) may be configured as a fluid absorption layer configured to absorb the fluid F produced in the endothermic phase change reaction. The inner first layer 235 (and/or the inner second layer 238) may be composed of a respective material having an endothermic heat of solution, i.e. one that absorbs heat upon dissolving, such as for example, sodium acetate. In other words, the inner first layer 235 (and/or the inner second layer 238) may be configured to grab the fluid F from the endothermic phase change reaction and simultaneously have a cooling effect.

Figure 3:
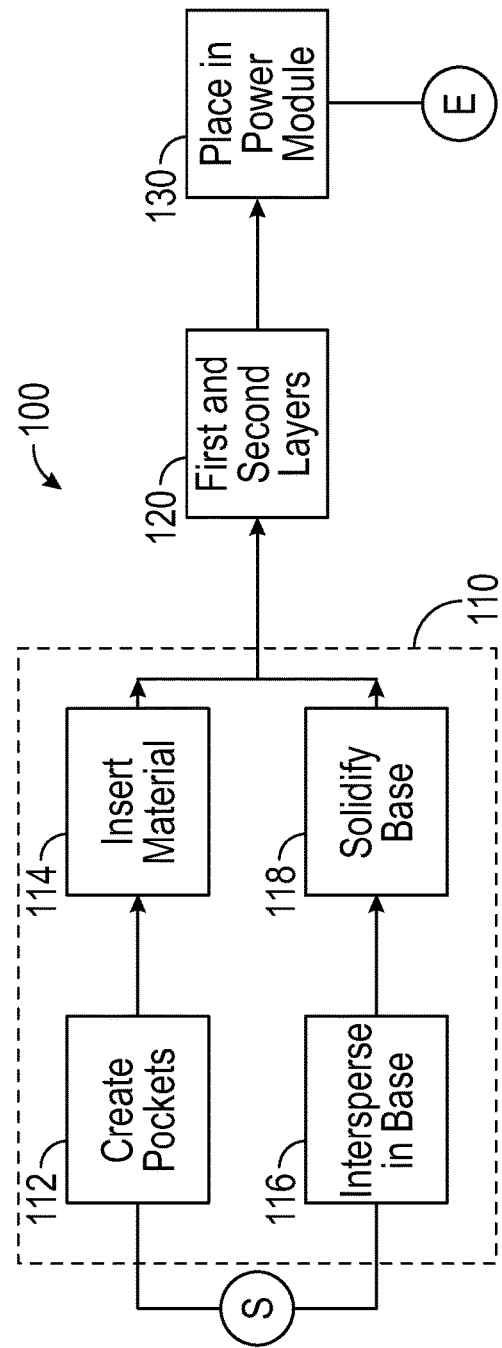
FIG. 3 is a schematic flow diagram for a method of forming the thermal barrier of FIG. 1.

Referring now to FIG. 3, a schematic flow diagram for a method 100 of forming the thermal barrier 10 is shown. Method 100 need not be applied in the specific order recited herein. Furthermore, it is to be understood that some steps may be eliminated. The method 100 may begin with block 110, which includes obtaining the compressible member 30 and depositing the phase change materials 42 respectively into the pockets 40. In one example, block 110 includes sub-blocks 112 and 114. Per sub-block 112, the pockets 40 are created in the compressible member 30, for example, by cutting out portions of the compressible member 30. Per sub-block 114, the phase change materials 42 are inserted into the pockets 40.

In another example, block 110 includes sub-blocks 116 and 118. Per sub-block 116, the compressible member 30 is composed of a polymeric base 330 (see FIG. 4C). While the polymeric base 330 is in a liquid form, the phase change materials 42 are mixed into the polymeric base 330. Next, per sub-block 118, the polymeric base 330 is solidified.

From block 110, the method 100 proceeds to block 120. Per block 120 of FIG. 3, the method 100 includes positioning the first layer 36 and the second layer 38 on the first side 32 and the second side 34 of the compressible member 30, respectively. The first layer 36 and the second layer 38 may comprise of a coating that is physically coated or bonded to the compressible member 30. The first layer 36 and the second layer 38 may be configured to be electrically insulating and thermally conductive.

From block 120, the method 100 proceeds to block 130. Per block 130 of FIG. 3, the thermal barrier 10 may be positioned in the power module assembly 12. As noted above with respect to FIG. 1, the thermal barrier 10 may be positioned between individual ones of the battery cell 14 and/or between stacks of the battery cell 14 arranged in respective modules 18. In summary, the thermal barrier 10 may be configured to serve a multitude of purposes, including but not limited to, absorbing heat, extinguishing flames, reflecting radiant heat and addressing expansion of the battery cell 14.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, as noted above, it is possible that each of the characteristics described in one of the examples of an embodiment can be combined with one or a plurality of other desired characteristics from other embodiments, resulting in other embodiments not described in words or by reference to the drawings. Accordingly, such other embodiments fall within the framework of the scope of the appended claims.

What is claimed is:

1. A thermal barrier for use in a power module assembly having at least one battery cell, the thermal barrier comprising:
at least one compressible member having one or more pockets, the at least one compressible member defining a first side and a second side;
a first layer and a second layer positioned adjacent to the at least one compressive member at the first side and the second side, respectively;
one or more phase change materials configured to be deposited into the one or more pockets; and
wherein the one or more phase change materials are configured to undergo an endothermic phase change reaction when a temperature of the at least one battery cell is at or above an activation temperature.

2. The thermal barrier of claim 1, wherein:
the at least one compressible member is composed of foam.

3. The thermal barrier of claim 1, wherein:
the first layer and the second layer are configured to at least partially reflect radiant heat.

4. The thermal barrier of claim 1, wherein:
the endothermic phase change reaction releases at least one fluid having flame extinguishing characteristics.

5. The thermal barrier of claim 4, wherein:
the one or more phase change materials include sodium bicarbonate; and
the at least one fluid includes carbon dioxide gas.

6. The thermal barrier of claim 1, wherein:
the first layer includes an outer first layer and an inner first layer;
the endothermic phase change reaction releases at least one fluid; and
the inner first layer is configured to absorb the fluid produced in the endothermic phase change reaction while simultaneously producing a cooling effect; and
the outer first layer is configured to at least partially reflect radiant heat.

7. The thermal barrier of claim 1, wherein:
the one or more phase change materials include at least one of or a combination of: aluminum bicarbonate, ammonium bicarbonate, beryllium bicarbonate, calcium bicarbonate, lithium bicarbonate, magnesium bicarbonate, potassium bicarbonate and sodium bicarbonate.

8. The thermal barrier of claim 1, wherein:
the one or more pockets include at least one through hole extending from the first side to the second side of the at least one compressible member.

9. The thermal barrier of claim 1, wherein:
the one or more pockets include a first set of blind holes extending along the first side and a second set of blind holes extending along the second side of the at least one compressible member.

10. The thermal barrier of claim 9, wherein:
the first set of blind holes are staggered relative to the second set of blind holes.

11. The thermal barrier of claim 1, wherein:
the at least one compressible member includes a polymeric base such that the one or more phase change materials are internally distributed within the polymeric base.

12. The thermal barrier of claim 1, wherein:
the one or more phase change materials include a first material characterized by a first activation temperature in a first range and a second material characterized by a second activation temperature in a second range, the first range being different from the second range.

13. A method of forming a thermal barrier for a power module assembly having at least one battery cell, the method comprising:
obtaining at least one compressible member defining a first side and a second side, and forming one or more pockets in the at least one compressible member;
depositing one or more phase change materials respectively into the one or more pockets, the one or more phase change materials being selected such that the one or more phase change materials undergo an endothermic phase change reaction when a temperature of the at least one battery cell is at or above an activation temperature; and
positioning a first layer and a second layer on the first side and the second side of the at least one compressible member, respectively.

14. The method of claim 13, wherein forming the one or more pockets includes:
forming at least one through hole extending from the first side to the second side of the at least one compressible member.

15. The method of claim 13, wherein forming the one or more pockets includes:
forming a first set of blind holes extending along the first side and a second set of blind holes extending along the second side of the at least one compressible member; and
staggering the first set of blind holes relative to the second set of blind holes.

16. The method of claim 13, further comprising,
positioning the thermal barrier in a vicinity of the at least one battery cell.

17. A power module assembly comprising:
at least one battery cell;
a thermal barrier configured to interface with the at least one battery cell, the thermal barrier including:
at least one compressible member having one or more pockets, the at least one compressible member defining a first side and a second side;
a first layer and a second layer positioned adjacent to the at least one compressive member at the first side and the second side, respectively; and
one or more phase change materials configured to be deposited into the one or more pockets; and
wherein the one or more phase change materials are configured to undergo an endothermic phase change reaction when a temperature of the at least one battery cell is at or above an activation temperature.

18. The power module assembly of claim 17, wherein:
the endothermic phase change reaction releases at least one fluid having flame extinguishing characteristics.

19. The power module assembly of claim 18, wherein:
the first layer includes an outer first layer and an inner first layer; and
the inner first layer is configured to absorb the at least one fluid produced in the endothermic phase change reaction while simultaneously producing a cooling effect.

20. The power module assembly of claim 19, wherein:
the outer first layer is configured to at least partially reflect radiant heat.

* * * * *